(12) United States Patent
Groe et al.

(10) Patent No.: US 7,974,374 B2
(45) Date of Patent: Jul. 5, 2011

(54) MULTI-MODE VCO FOR DIRECT FM SYSTEMS

(75) Inventors: John B. Groe, Poway, CA (US); Joe Austin, San Diego, CA (US); Damian Costa, San Diego, CA (US)

(73) Assignee: Quintic Holdings, Santa Clara, CA (US)

(*) Notice: Subject to any disclaimer, the term of this patent is extended or adjusted under 35 U.S.C. 154(b) by 708 days.

(21) Appl. No.: 11/749,538

(22) Filed: May 16, 2007

(65) Prior Publication Data

US 2007/0291889 A1 Dec. 20, 2007

Related U.S. Application Data

(60) Provisional application No. 60/800,970, filed on May 16, 2006.

(51) Int. Cl.
*H03D 3/24* (2006.01)

(52) U.S. Cl. .......... 375/376; 331/167

(58) Field of Classification Search .......... 375/371–376; 331/167–171
See application file for complete search history.

(56) References Cited

U.S. PATENT DOCUMENTS

| | | |
|---|---|---|
| 4,263,560 A | 4/1981 | Ricker |
| 4,430,627 A | 2/1984 | Machida |
| 4,769,588 A | 9/1988 | Panther |
| 4,816,772 A | 3/1989 | Klotz |
| 4,926,135 A | 5/1990 | Voorman |
| 4,965,531 A | 10/1990 | Riley |
| 5,006,818 A | 4/1991 | Koyama et al. |
| 5,015,968 A | 5/1991 | Podell et al. |
| 5,030,923 A | 7/1991 | Arai |
| 5,289,136 A | 2/1994 | DeVeirman et al. |
| 5,331,292 A | 7/1994 | Worden et al. |
| 5,399,990 A | 3/1995 | Miyake |
| 5,491,450 A | 2/1996 | Helms et al. |
| 5,508,660 A | 4/1996 | Gersbach et al. |
| 5,548,594 A | 8/1996 | Nakamura |
| 5,561,385 A | 10/1996 | Choi |
| 5,581,216 A | 12/1996 | Ruetz |
| 5,625,325 A | 4/1997 | Rotzoll et al. |
| 5,631,587 A | 5/1997 | Co et al. |
| 5,648,744 A | 7/1997 | Prakash et al. |
| 5,677,646 A | 10/1997 | Entrikin |
| 5,739,730 A | 4/1998 | Rotzoll |
| 5,767,748 A | 6/1998 | Nakao |
| 5,818,303 A | 10/1998 | Oishi et al. |
| 5,834,987 A | 11/1998 | Dent |

(Continued)

OTHER PUBLICATIONS

PCT International Search Report re Application serial No. PCT/US69079 mailed on Feb. 13, 2008.

*Primary Examiner* — Curtis B Odom
(74) *Attorney, Agent, or Firm* — Blairtech Solution LLC

(57) ABSTRACT

Systems for multi-mode phase modulation are disclosed. Systems provide for direct modulation of a multi-mode voltage controlled oscillator (VCO). A fractional-N counter may be used in a phase-locked loop (PLL) to synthesize a radio frequency carrier signal. The multi-mode VCO may be characterized by a first frequency gain during operation in a first mode and by a second frequency gain during operation in a second mode where signals controlling the first and second operating modes are provided by a control circuit. The control circuit may include a switch to provide control signals to the VCO.

5 Claims, 15 Drawing Sheets

U.S. PATENT DOCUMENTS

| | | | |
|---|---|---|---|
| 5,862,465 A | 1/1999 | Ou |
| 5,878,101 A | 3/1999 | Aisaka |
| 5,880,631 A | 3/1999 | Sahota |
| 5,939,922 A | 8/1999 | Umeda |
| 5,945,855 A | 8/1999 | Momtaz |
| 5,949,286 A | 9/1999 | Jones |
| 5,990,740 A | 11/1999 | Groe |
| 5,994,959 A | 11/1999 | Ainsworth |
| 5,999,056 A | 12/1999 | Fong |
| 6,011,437 A | 1/2000 | Sutardja et al. |
| 6,018,651 A | 1/2000 | Bruckert et al. |
| 6,031,425 A | 2/2000 | Hasegawa |
| 6,044,124 A | 3/2000 | Monahan et al. |
| 6,052,035 A | 4/2000 | Nolan et al. |
| 6,057,739 A | 5/2000 | Crowley et al. |
| 6,060,935 A | 5/2000 | Shulman |
| 6,091,307 A | 7/2000 | Nelson |
| 6,100,767 A | 8/2000 | Sumi |
| 6,114,920 A | 9/2000 | Moon et al. |
| 6,163,207 A | 12/2000 | Kattner et al. |
| 6,173,011 B1 | 1/2001 | Rey et al. |
| 6,191,956 B1 | 2/2001 | Foreman |
| 6,204,728 B1 | 3/2001 | Hageraats |
| 6,211,737 B1 | 4/2001 | Fong |
| 6,229,374 B1 | 5/2001 | Tammone, Jr. |
| 6,246,289 B1 | 6/2001 | Pisati et al. |
| 6,255,889 B1 | 7/2001 | Branson |
| 6,259,321 B1 | 7/2001 | Song et al. |
| 6,288,609 B1 | 9/2001 | Brueske et al. |
| 6,298,093 B1 | 10/2001 | Genrich |
| 6,333,675 B1 | 12/2001 | Saito |
| 6,370,372 B1 | 4/2002 | Molnar et al. |
| 6,392,487 B1 | 5/2002 | Alexanian |
| 6,404,252 B1 | 6/2002 | Wilsch |
| 6,476,660 B1 | 11/2002 | Visocchi et al. |
| 6,515,553 B1 | 2/2003 | Filiol et al. |
| 6,559,717 B1 | 5/2003 | Lynn et al. |
| 6,560,448 B1 | 5/2003 | Baldwin et al. |
| 6,571,083 B1 | 5/2003 | Powell, II et al. |
| 6,577,190 B2 | 6/2003 | Kim |
| 6,583,671 B2 | 6/2003 | Chatwin |
| 6,583,675 B2 | 6/2003 | Gomez |
| 6,639,474 B2 | 10/2003 | Asikainen et al. |
| 6,664,865 B2 | 12/2003 | Groe et al. |
| 6,667,668 B1 * | 12/2003 | Henrion ............ 332/149 |
| 6,683,509 B2 | 1/2004 | Albon et al. |
| 6,693,977 B2 | 2/2004 | Katayama et al. |
| 6,703,887 B2 | 3/2004 | Groe |
| 6,711,391 B1 | 3/2004 | Walker et al. |
| 6,724,235 B2 | 4/2004 | Costa et al. |
| 6,734,736 B2 | 5/2004 | Gharpurey |
| 6,744,319 B2 | 6/2004 | Kim |
| 6,751,272 B1 | 6/2004 | Burns et al. |
| 6,753,738 B1 | 6/2004 | Baird |
| 6,763,228 B2 | 7/2004 | Prentice et al. |
| 6,774,740 B1 | 8/2004 | Groe |
| 6,777,999 B2 | 8/2004 | Kanou et al. |
| 6,781,425 B2 | 8/2004 | Si |
| 6,795,843 B1 | 9/2004 | Groe |
| 6,798,290 B2 | 9/2004 | Groe et al. |
| 6,801,089 B2 | 10/2004 | Costa et al. |
| 6,845,139 B2 | 1/2005 | Gibbons |
| 6,856,205 B1 | 2/2005 | Groe |
| 6,870,411 B2 | 3/2005 | Shibahara et al. |
| 6,917,791 B2 | 7/2005 | Chadwick |
| 6,940,356 B2 | 9/2005 | McDonald, II et al. |
| 6,943,600 B2 | 9/2005 | Craninckx |
| 6,975,687 B2 | 12/2005 | Jackson et al. |
| 6,985,703 B2 | 1/2006 | Groe et al. |
| 6,990,327 B2 | 1/2006 | Zheng et al. |
| 7,062,248 B2 | 6/2006 | Kuiri |
| 7,065,334 B1 | 6/2006 | Otaka et al. |
| 7,088,979 B1 | 8/2006 | Shenoy et al. |
| 7,123,102 B2 | 10/2006 | Uozumi et al. |
| 7,142,062 B2 | 11/2006 | Vaananen et al. |
| 7,148,764 B2 | 12/2006 | Kasahara et al. |
| 7,171,170 B2 | 1/2007 | Groe et al. |
| 7,215,215 B2 | 5/2007 | Hirano et al. |
| 2002/0071497 A1 | 6/2002 | Bengtsson et al. |
| 2002/0135428 A1 | 9/2002 | Gomez |
| 2002/0193009 A1 | 12/2002 | Reed |
| 2003/0078016 A1 | 4/2003 | Groe et al. |
| 2003/0092405 A1 | 5/2003 | Groe et al. |
| 2003/0118143 A1 | 6/2003 | Bellaouar et al. |
| 2003/0197564 A1 | 10/2003 | Humphreys et al. |
| 2004/0017862 A1 | 1/2004 | Redman-White |
| 2004/0051590 A1 | 3/2004 | Perrott et al. |
| 2005/0052250 A1 * | 3/2005 | Tanzawa ............ 331/23 |
| 2005/0093631 A1 | 5/2005 | Groe |
| 2005/0099232 A1 | 5/2005 | Groe et al. |
| 2005/0242895 A1 * | 11/2005 | Lotfi ............ 331/177 V |
| 2006/0003720 A1 | 1/2006 | Lee et al. |

\* cited by examiner

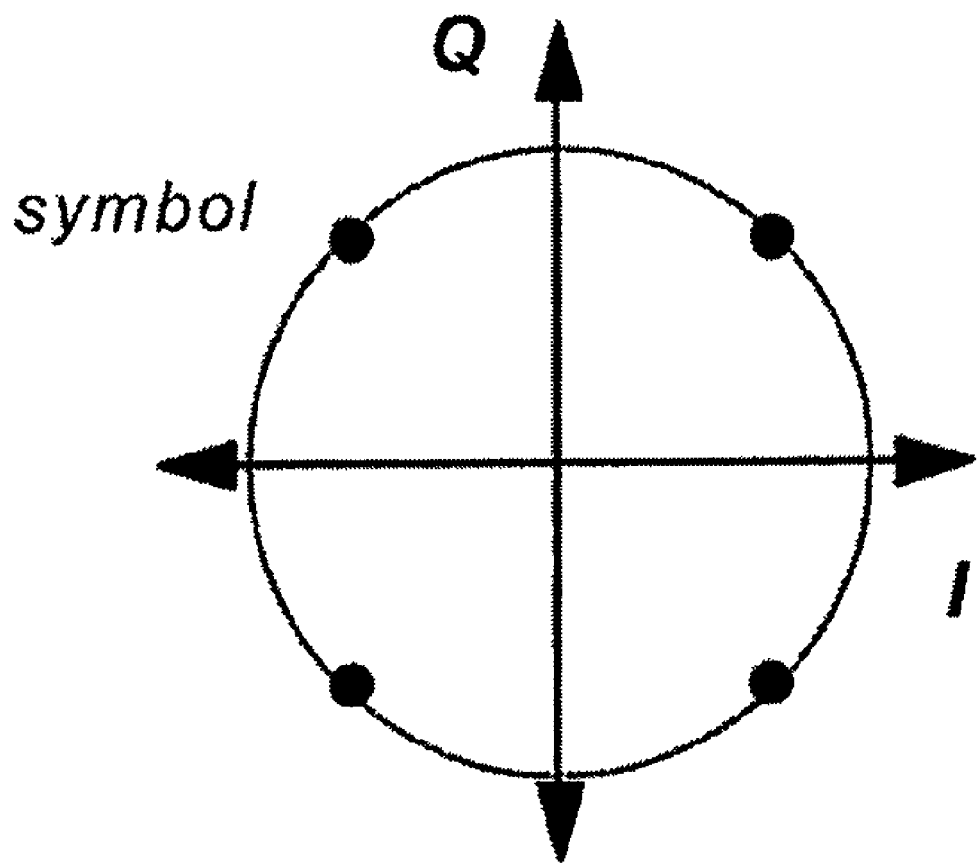
Figure 1. QPSK constellation diagram

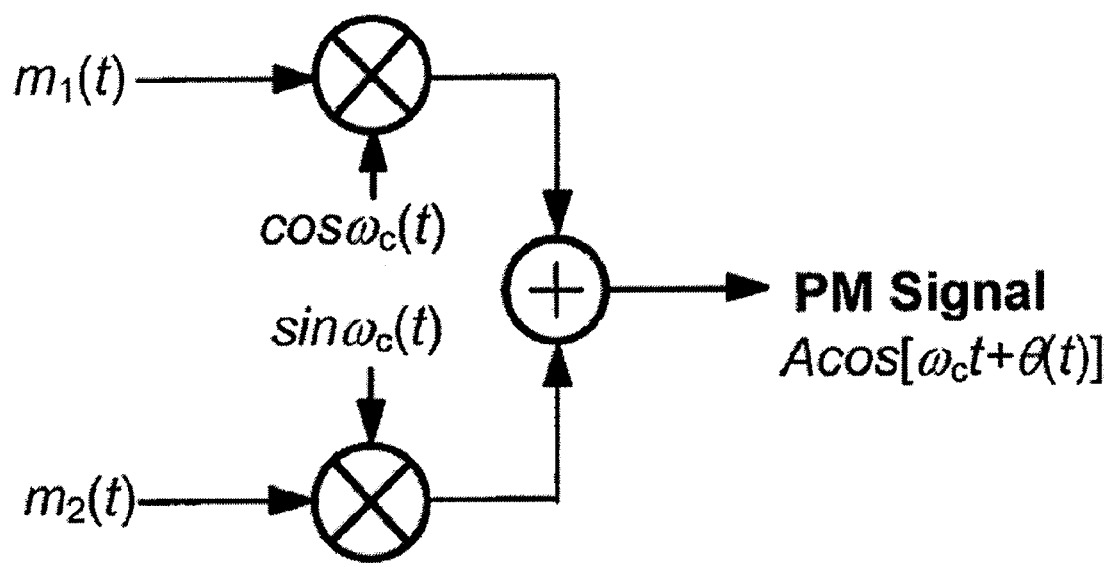
Figure 2. Typical I/Q modulator

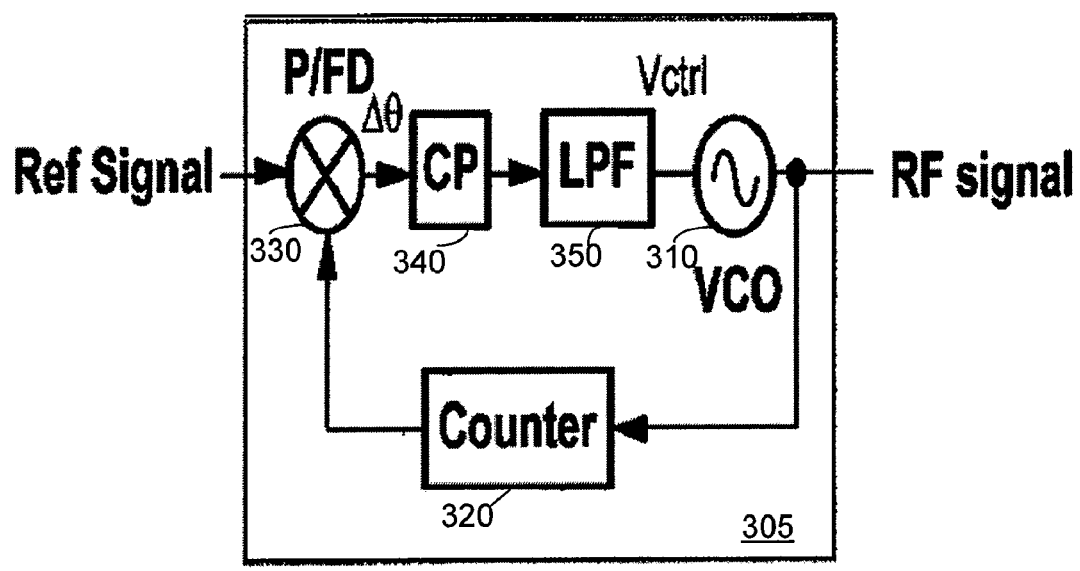
Figure 3. Conventional PLL

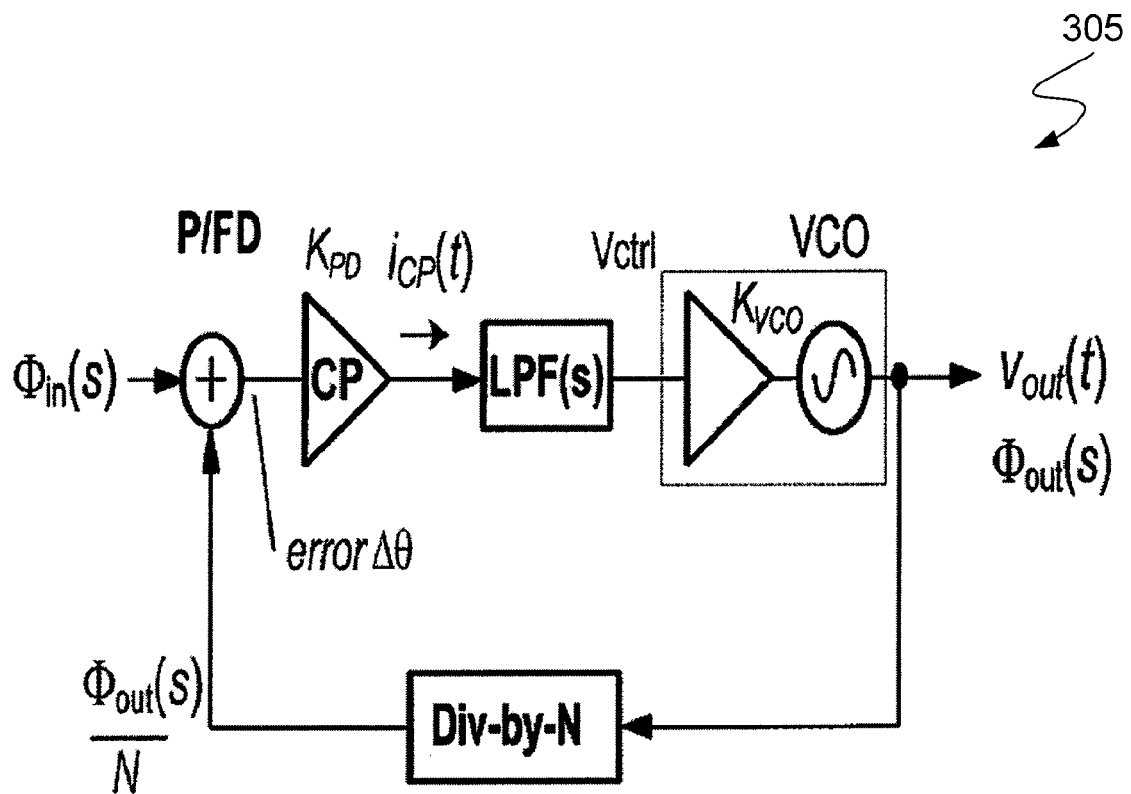
Figure 4. Mathematical Model of the PLL

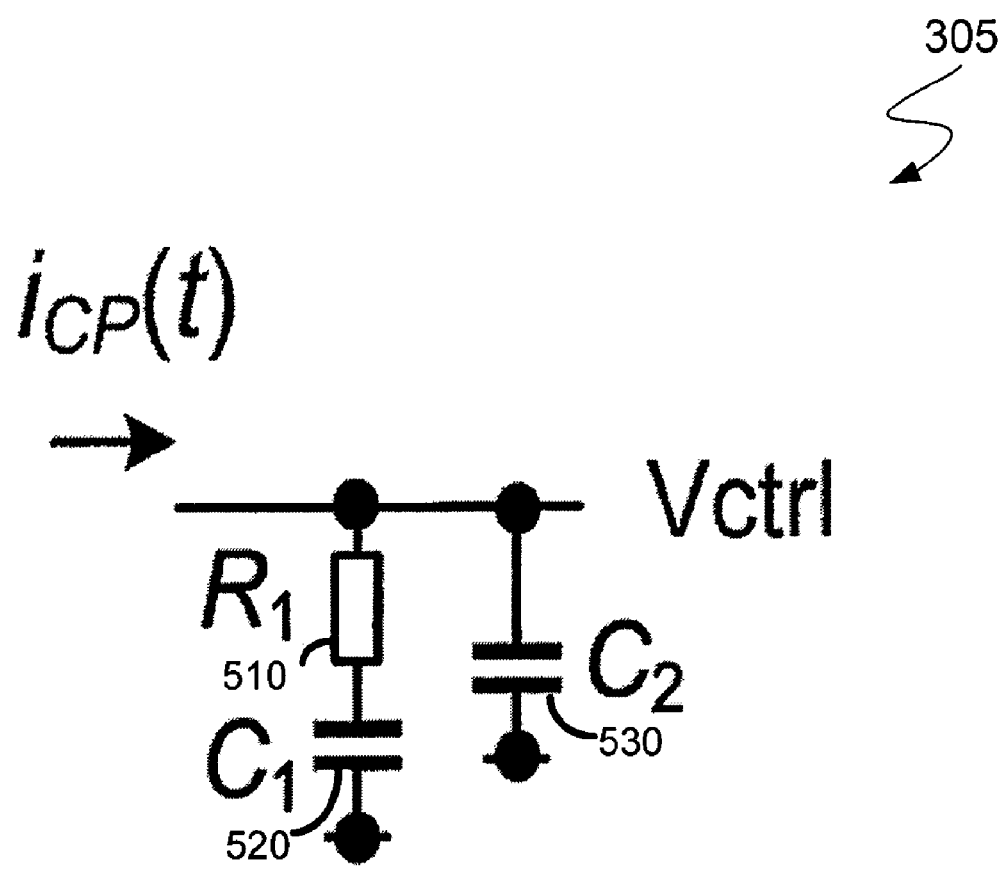
Figure 5. Integration Filter

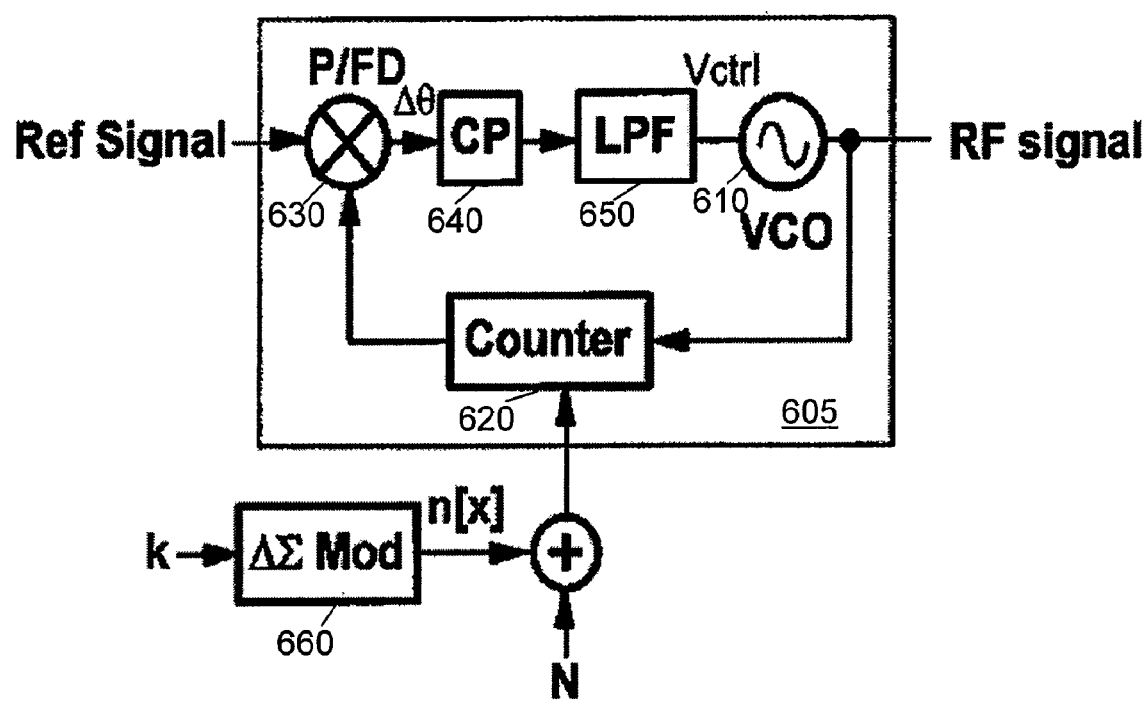
Figure 6. Fractional-N PLL using a ΔΣ modulator

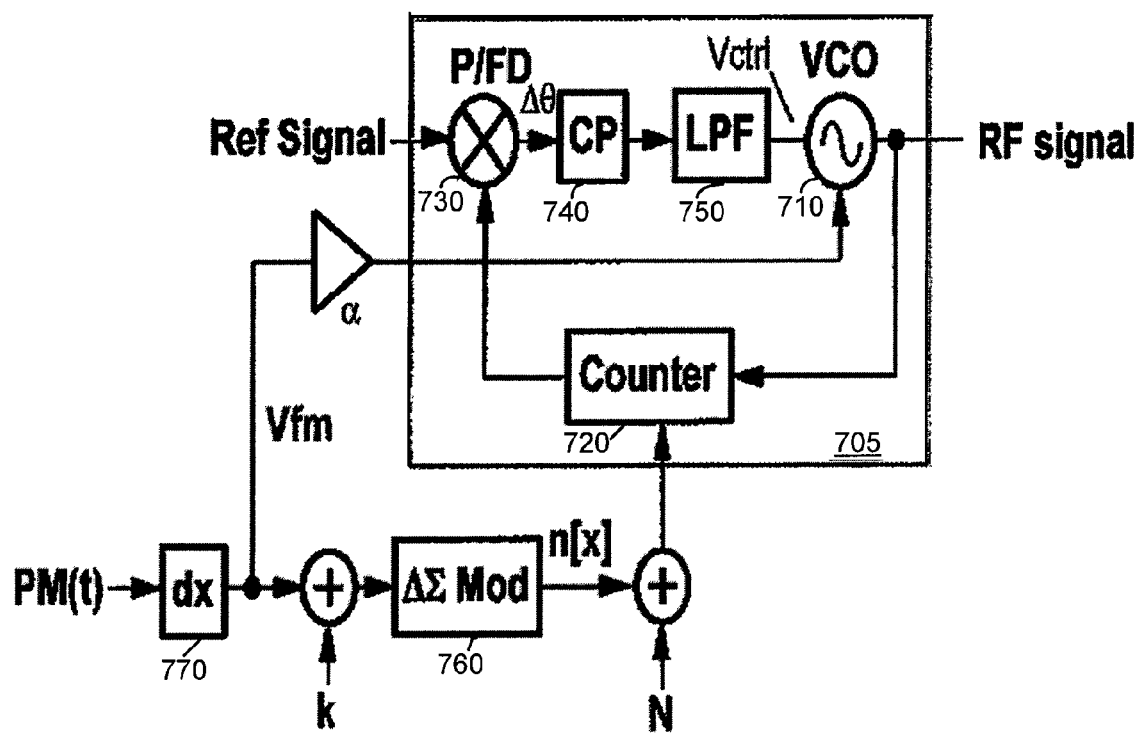
Figure 7. Direct Phase/Frequency Modulator

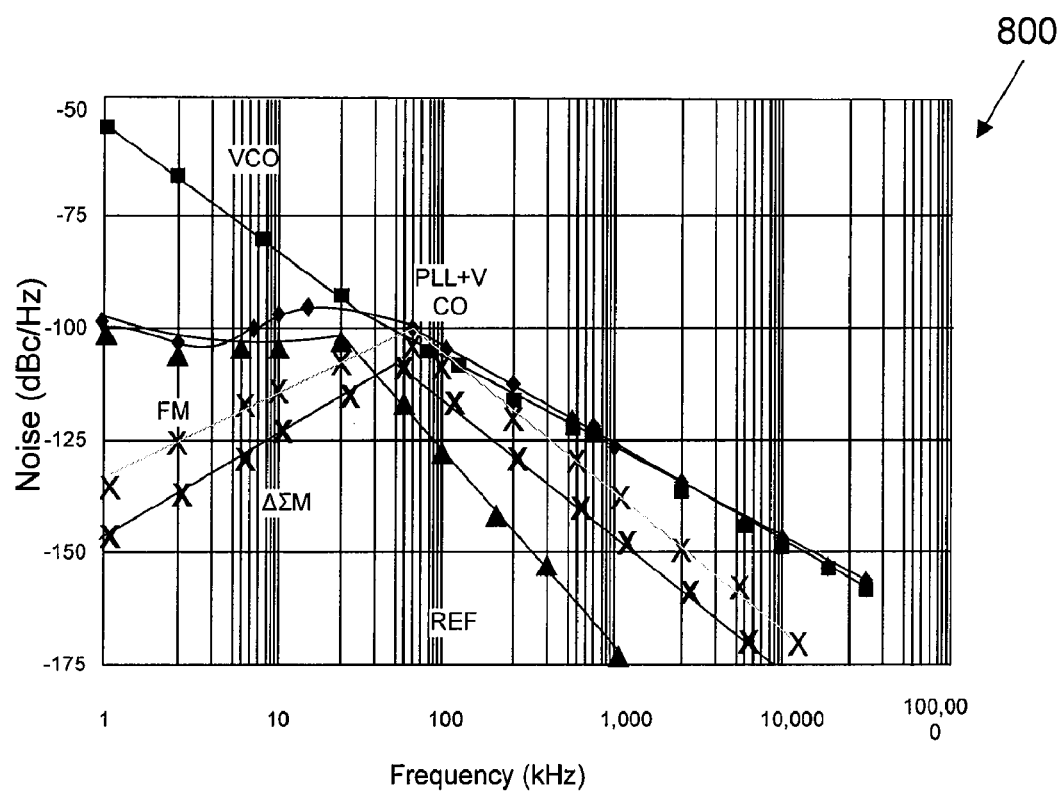
Figure 8. Phase Noise Spectrum of the Fractional-N PLL with Direct Phase/Frequency Modulation

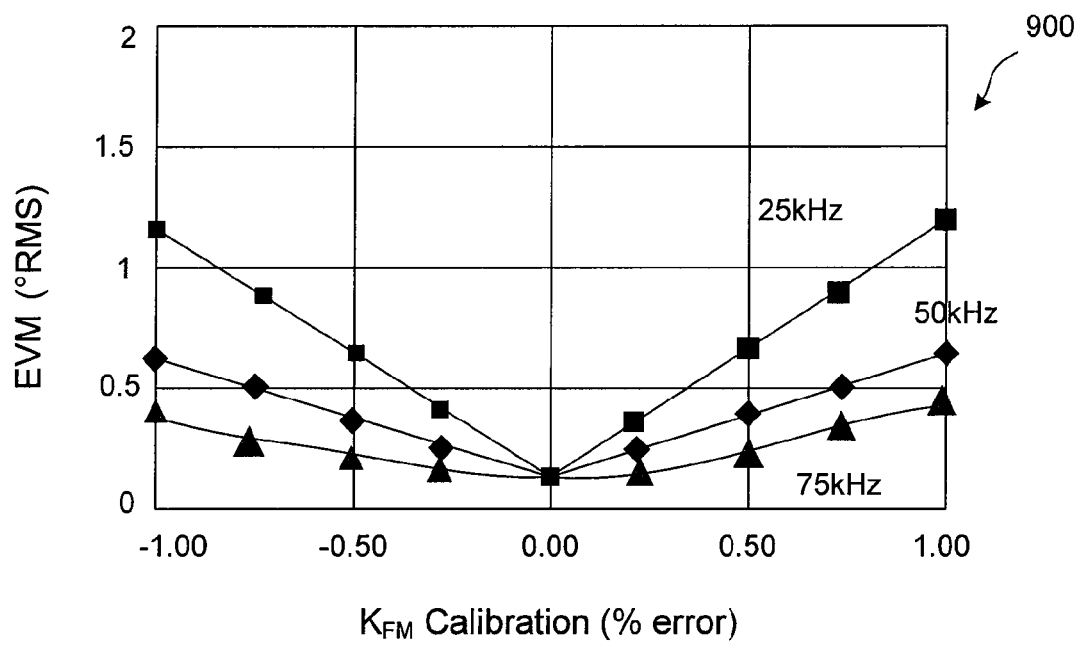
Figure 9. PLL Bandwidth Effects on Modulation Accuracy

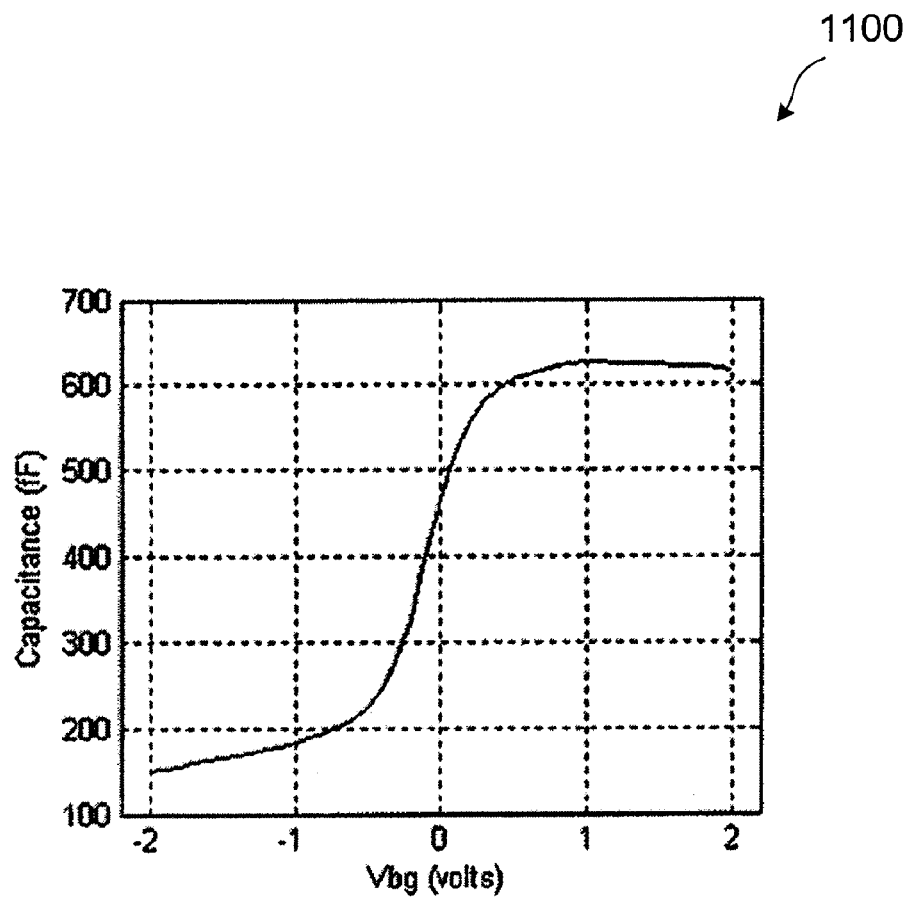
Figure 11. C-V Relationship for Accumulation-Mode MOSFET Device

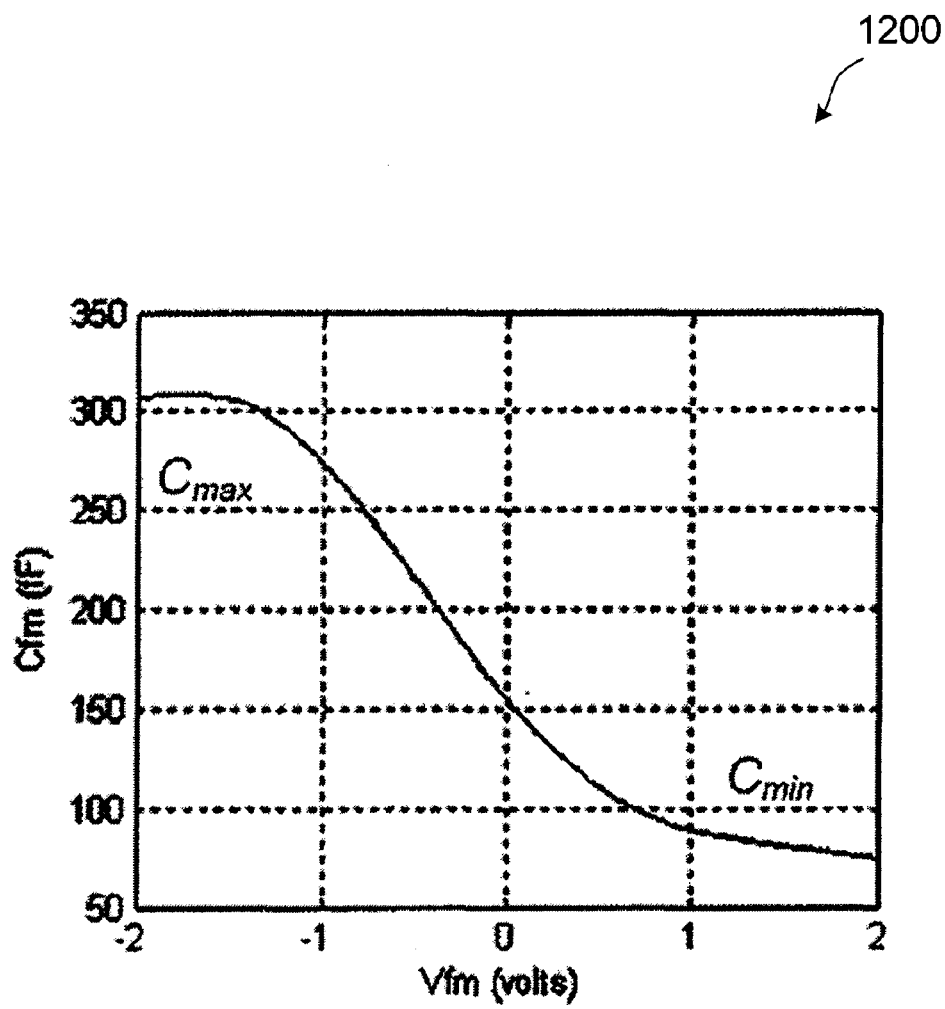
Figure 12. Behavior of the back-to-back MOSFET Devices in VCO

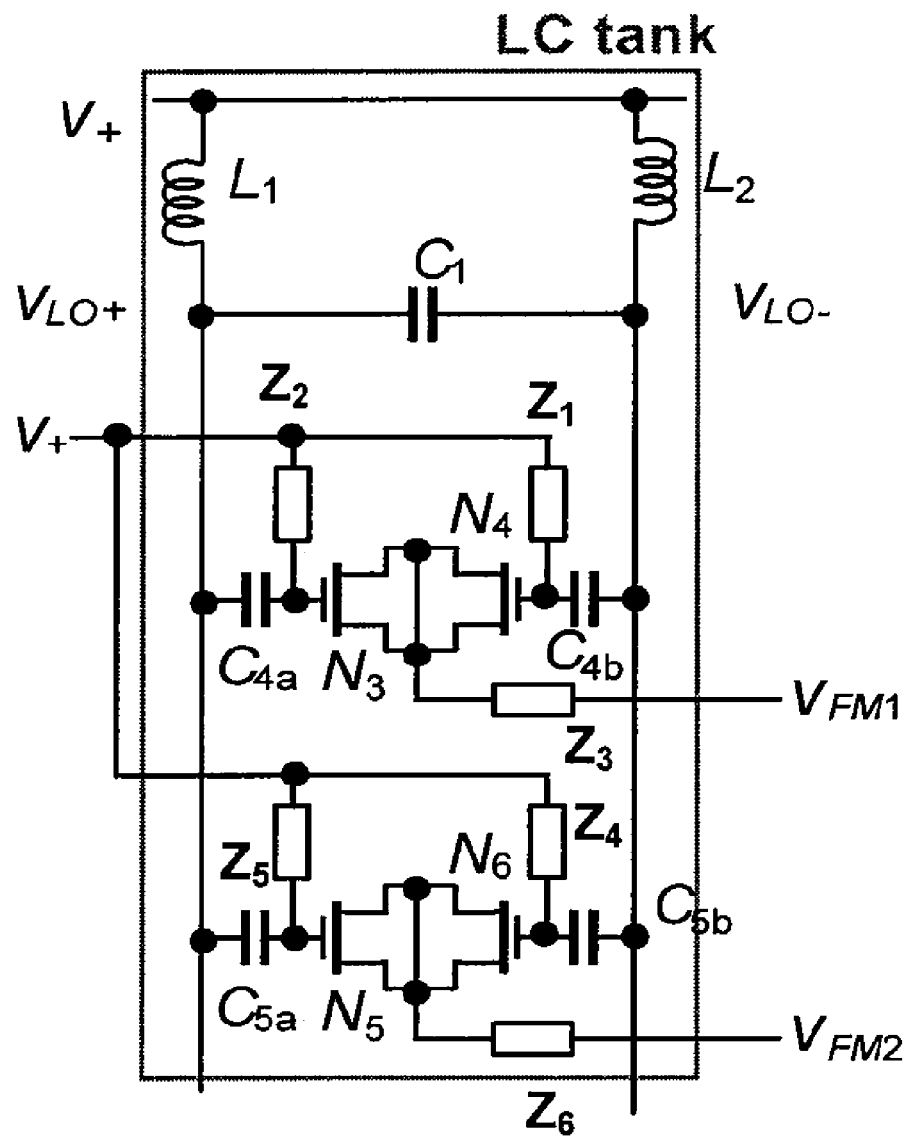
Figure 13. Multi-Port VCO

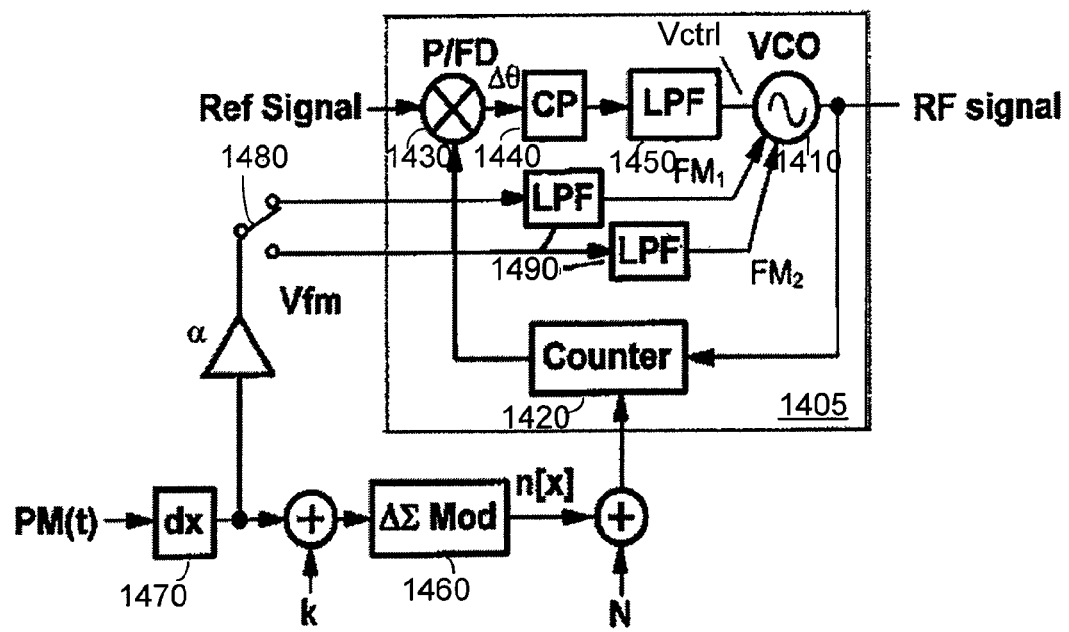
Figure 14. Multi-mode Direct Phase/Frequency Modulator

MULTI-MODE VCO FOR DIRECT FM SYSTEMS

CROSS REFERENCE TO RELATED APPLICATIONS

This application claims priority under 35 U.S.C. §119(e) of co-pending U.S. Provisional Patent Application Ser. No. 60/800,970, entitled A MULTI-MODE VCO FOR DIRECT FM SYSTEMS, filed on May 16, 2006.

This application is also related to U.S. patent application entitled "DIRECT SYNTHESIS TRANSMITTER" Ser. No. 10/265,215, U.S. patent application entitled "HIGHLY LINEAR PHASE MODULATION" Ser. No. 10/420,952, and U.S. Provisional Patent Application entitled "LINEAR, WIDEBAND PHASE MODULATION SYSTEM" Ser. No. 60/658,898, the disclosures of which are incorporated herein by reference for all purposes.

FIELD OF THE INVENTION

The present invention relates generally to phase/frequency modulators, and more particularly, to a multi-mode architecture for direct phase/frequency modulation of a phase-locked loop.

BACKGROUND OF THE INVENTION

Phase modulation schemes are very effective and are therefore widely used in communication systems. A simple example of a phase modulation scheme is quaternary phase shift keying (QPSK). FIG. 1 shows a constellation diagram that illustrates how QPSK maps two-bit digital data to one of four phase offsets. FIG. 2 shows a typical QPSK (or in-phase (I)/quadrature (Q)) modulator used to generate a phase-modulated signal. This technique relies on orthogonal signal vectors to realize the phase offsets—an inherently linear technique, since it depends solely on the matching of these orthogonal signals.

The I/Q modulator provides a straightforward approach to generating phase-modulated signals that is also suitable for more complex schemes such as wideband Code-Division Multiple Access (CDMA) and Orthogonal Frequency Division Multiplexing (OFDM) systems. It is also possible to generate the phase-modulated signals using a phase-locked loop (PLL). This approach offers reduced circuitry and lower power consumption and, as a result, finds widespread use in narrowband systems. Unfortunately, the flexibility of the voltage-controlled oscillator (VCO) within the PLL architecture is limited. This is a severe disadvantage in multi-mode systems. It would therefore be advantageous to have a flexible, multi-mode VCO for use by a phase modulator.

SUMMARY OF THE INVENTION

A very efficient system for multi-mode phase modulation is provided. Embodiments of the inventive system include circuitry for direct modulation of a multi-mode voltage-controlled oscillator (VCO) used in a phase-locked loop (PLL) to synthesize a radio frequency carrier signal.

In one aspect the present invention is directed to a phase-locked loop module which includes a multi-mode voltage-controlled oscillator for generating an output signal of a frequency determined at least in part by a control voltage. The multi-mode voltage-controlled oscillator is characterized by a first frequency gain during operation in a first mode and a second frequency gain during operation in a second mode. The phase-locked loop module also includes divider circuit for dividing the output signal to produce a frequency-divided signal. A phase/frequency detector is disposed to compare phases between an input reference signal and the frequency-divided signal and to produce at least one phase error signal. A charge pump circuit produces a charge pump signal in response to the at least one phase error signal. A loop filter produces the control voltage in response to the charge pump signal.

In another aspect the invention relates to a multi-mode voltage-controlled oscillator including a first input port, a second input port and an LC tank circuit. The LC tank circuit is configured to operate in accordance with a first frequency gain in response to a first signal received at the first input port and in accordance with a second frequency gain in response to a second signal received at the second input port.

The present invention also pertains to a multi-mode modulation apparatus comprising a phase-locked loop and a switching network. The phase-locked loop includes a multi-mode voltage-controlled oscillator configured to realize a first frequency gain in response to a first control signal and a second frequency gain in response to a second control signal. The switching network is disposed to generate the first control signal during operation in a first mode and the second control signal during operation in a second mode.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein:

FIG. 1 shows a constellation diagram that illustrates how quaternary phase shift keying (QPSK) maps two-bit digital data to one of four offsets;

FIG. 2 shows a diagram of a typical I/Q modulator;

FIG. 3 shows a phase-locked loop (PLL) that is used to synthesize a radio frequency carrier signal;

FIG. 4 shows a mathematical model of the PLL shown in FIG. 3;

FIG. 5 shows an integration filter;

FIG. 6 shows one embodiment of a fractional-N PLL using a □□ modulator;

FIG. 7 illustrates one embodiment of a fractional-N PLL that supports direct frequency or phase modulation;

FIG. 8 shows a graph of the phase noise spectrum produced by a fractional-N PLL supporting direct modulation;

FIG. 9 shows a graph that illustrates the relationship between PLL bandwidth and modulation accuracy of a fractional-N PLL supporting direct modulation;

FIG. 11 shows the capacitance-voltage relationship for an accumulation-mode MOSFET device;

FIG. 12 shows the linear capacitance-voltage response from back to back MOSFET devices;

FIG. 13 shows one embodiment of a VCO tank circuit that includes two auxiliary ports to support direct phase/frequency modulation; and FIG. 14 shows one embodiment of a multi-mode phase/frequency modulator.

DETAILED DESCRIPTION

Figure 10A:
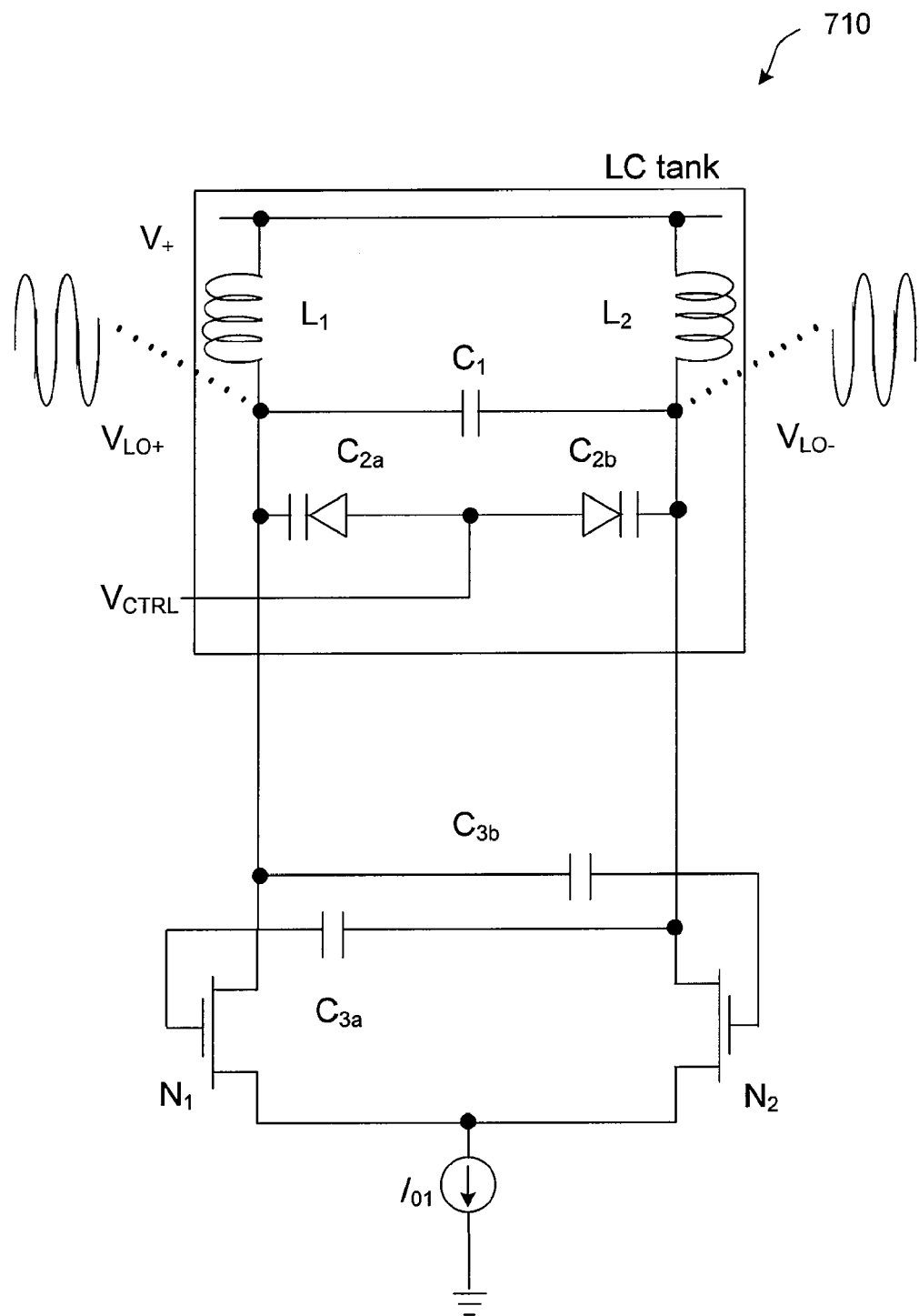
FIG. 10a shows a detailed view of a voltage-controlled oscillator (VCO)

FIG. 3 is a phase-locked loop (PLL) 305. The PLL 305 includes a voltage-controlled oscillator (VCO) 310, a feedback counter 320, a phase/frequency detector (P/FD) 330, a charge pump (CP) 340, and an integration filter (LPF) 350. Elements of the PLL 305 of FIG. 3 are described by the mathematical model shown in FIG. 4.

The PLL 305 uses feedback to minimize the phase difference between a very accurate reference signal and its output (RF) signal. As such, it produces an output signal at a frequency given by $$f_{VCO} = Nf_{REF},$$

where $f_{vco}$ is the frequency of the VCO 310 output signal, N is the value of the feedback counter 320, and $f_{REF}$ is the frequency of the reference signal.

The VCO 310 produces an output signal at a frequency set by the control voltage $v_{ctrl}$ according to $$v_{out}(t) = A\cos(\omega_0 t + K_{vco}\int v_{ctrl}(t)dt),$$

where $\omega_o$ is the free-running frequency of the VCO 310 and $K_{vco}$ is the gain of the VCO 310. The gain $K_{vco}$ describes the relationship between the excess phase of the carrier $\Phi_{out}$ and the control voltage $V_{ctrl}$ with $$\frac{\Phi_{out}(s)}{v_{ctrl}(s)} = \frac{K_{vco}}{s},$$

where $K_{vco}$ is in rads/V. The VCO 310 drives the feedback counter 320, which simply divides the output phase $\Phi_{out}$ by N.

When the PLL 305 is locked, the phase detector 330 and charge pump 340 generate an output signal $i_{CP}$ that is proportional to the phase difference $\Delta\theta$ between the two signals applied to the phase detector 330. The output signal $i_{CP}$ can therefore be expressed as $$i_{CP}(s) = K_{pd}\frac{\Delta\theta(s)}{2\pi},$$

where $K_{pd}$ is in A/radians and $\Delta\theta$ is in radians.

Attention is now drawn to FIG. 5, which depicts an implementation of the integration filter 350. The integration filter 350 includes a resistor $R_1$ 510 and capacitors $C_1$ 520 and $C_2$ 530. As shown, the integration filter 350 transforms the output signal $i_{CP}$ to the control voltage $v_{ctrl}$ as follows $$v_{ctrl}(s) = i_{out}(s)\left(\frac{sR_1C_1 + 1}{s^2R_1C_1C_2 + s(C_1 + C_2)}\right),$$

where a zero (e.g., at $1/R_1C_1$) has been added to stabilize the second order system and the capacitor $C_2$ 530 has been included to reduce any ripple on the control voltage $v_{crtl}$. Combining the above relationships yields the composite open-loop transfer function $$GH(s) = K_{PD}\frac{K_{VCO}}{s}\left[\frac{sR_1C_1 + 1}{s^2R_1C_1C_2 + s(C_1 + C_2)}\right],$$

which includes two poles at the origin (due to the VCO 310 and the integration filter 350). The closed-loop response of the system is $$T(s) = \frac{NK_{PD}K_{VCO}(sR_1C_1 + 1)}{s^3NR_1C_1C_2 + s^2N(C_1 + C_2) + K_{PD}K_{VCO}(sR_1C_1 + 1)},$$

which includes the stabilizing zero and two complex poles. The equation T(s) describes the response of the PLL 305 to the low-noise reference signal.

The value N of the feedback counter 320 sets the output frequency of the PLL 305. Its digital structure restricts N to integer numbers. As a result, the frequency resolution (or frequency step size) of the integer-N PLL 305 is nominally set by $f_{REF}$. Fortunately, it is possible to dramatically decrease the effective frequency step by manipulating the value of N to yield a non-integer average value. This is the concept of a fractional-N PLL described with respect to FIGS. 6, 7 and 14.

FIG. 6 is a fractional-N PLL 605 that uses a $\Delta\Sigma$ modulator 660 to develop non-integer values of N. The $\Delta\Sigma$ modulator 660 advantageously pushes spurious energy (created by the changing values of the feedback counter 620) to higher frequencies to be more effectively attenuated by the integration filter 650. It can be shown that the effective value of N is simply the average value described by $$N = \frac{\sum_{x=1}^{P} N[x]}{P},$$

where N[x] is the sequence of values of the feedback counter 620. This expands to $$N[x] = N_{int} + n[x],$$

where $N_{int}$ is the integer part and n[x] is the fractional part of N[x]. The $\Delta\Sigma$ modulator 660 generates the sequence n[x], that satisfies $$\frac{\sum_{x=1}^{P} n[x]}{P} = \frac{k}{M},$$

where k is the input to the $\Delta\Sigma$ modulator 660 with resolution M. In practice, the order of the $\Delta\Sigma$ modulator 660 dictates the range of n[x].

The $\Delta\Sigma$ modulator 660 introduces quantization noise that appears at the output of the PLL 605 along with other noise sources. These noise sources all map differently to the output of the PLL 605, depending on the associated transfer function. Noise applied with the reference signal is affected by the transfer function described earlier. This transfer function is represented by $$T_1(s) = \frac{NK_{PD}K_{VCO}(sR_1C_1 + 1)}{s^3NR_1C_1C_2 + s^2N(C_1 + C_2) + K_{PD}K_{VCO}(sR_1C_1 + 1)},$$

which shows a low pass response. The above transfer function similarly shapes any noise at the output of the feedback counter 620. Noise generated by the VCO 610 is subject to a different transfer function $$T_2(s) = \frac{s^2 N(sR_1C_1C_2 + C_1 + C_2)}{s^2 NR_1C_1C_2 + s[N(C_1 + C_2) + K_{PD}K_{VCO}R_1C_1] + K_{PD}K_{VCO}},$$

which shows a high pass response.

The noise at the output of the feedback counter 620 is dominated by the ΔΣ modulator 660. It creates a pseudorandom sequence n[x] possessing a quantization error approximately equal to ±½ N or $$\Delta = \frac{1}{N},$$

It follows that the quantization noise spectral density for this error, assuming a uniform distribution, is expressed by $$e_{rms}^2(f) = \frac{1}{6N^2 f_{REF}}.$$

over the frequency range of dc to $f_{REF}/2$. This quantization noise is advantageously shaped by an $L^{th}$ order ΔΣ modulator 660 according to $$DS(z) = (1-z^{-1})^L.$$

In the PLL 605, the feedback counter 620 acts as a digital accumulator and reduces the effects of the ΔΣ modulator 660. That is, the output phase from the feedback counter 620 depends on its previous output phase. The transfer function for the feedback counter 620 is therefore $$P(z) = 2\pi \frac{z^{-1}}{1-z^{-1}},$$

Combining these terms shows that the output noise of the feedback counter 620 is equal to $$n^2(f) = e_{rms}^2(f)[DS(f)]^2[P(f)]^2,$$

which yields $$n^2(f) = \frac{2}{3} \frac{\pi^2}{N^2 f_{REF}} \left[ 2\sin\left(\frac{\pi f}{f_{REF}}\right) \right]^L,$$

and appears at the output of the PLL 605 shaped by transfer function $T_1(s)$ presented above. Direct phase/frequency modulation further increases phase noise because an additional noise source is added to the system of FIG. 6.

FIG. 7 shows a fractional-N PLL 705 supporting direct VCO modulation. The system of FIG. 7 directly modulates the VCO 710 and thereby controls the frequency of the VCO 710. To realize phase modulation, the modulation signal PM(t) must therefore be differentiated (e.g., via a differentiator device 770) with $$fm(t) = \frac{d}{dt}[pm(t)].$$

This is due to the fundamental relationship $$\theta(t) = \int_0^t f(t)\,dt,$$

which shows that frequency integrates over time.

Any noise present at the frequency modulation (FM) port of the VCO 710 appears at the output of the PLL 705 (e.g., RF signal), modified by the following transfer function $$T_3(s) = \frac{s^2 NK_{FM}(sR_1C_1C_2 + C_1 + C_2)}{s^2 NR_1C_1C_2 + s[N(C_1 + C_2) + K_{PD}K_{VCO}R_1C_1] + K_{PD}K_{VCO}}.$$

As shown in chart 800 of FIG. 8, any noise associated with an FM signal $v_{FM}$ adds to the system and increases the phase noise spectrum.

The feedback of the PLL 705 naturally resists the direct phase/frequency modulation of the VCO 710. To avoid this effect, the FM signal is also applied to the feedback counter 720 through the ΔΣ modulator 760. This ideally subtracts the frequency modulation applied at the VCO 710 so that the output of the counter 720 represents only the RF carrier frequency.

Direct VCO modulation requires near exact control of the frequency of the VCO 710. This is because frequency errors produce phase deviations that accumulate with time. Fortunately, the feedback of the PLL 705 helps to reduce any frequency error. This is because the output of the VCO 710 is driven by the feedback of the PLL 705 to exactly $$f_{VCO} = Nf_{REF} + FMf_{REF},$$

which is also essentially equal to $$f_{VCO} = K_{VCO}v_{ctrl} + K_{FM}v_{FM},$$

where $v_{ctrl}$ is the error signal produced by the phase/frequency detector 730, $v_{FM}$ is the FM signal applied to the VCO 710, and $K_{FM}$ is the gain of the VCO 710 associated with the FM signal. Consequently, the error signal $v_{ctrl}$ compensates for any VCO 710 gain errors within the bandwidth of the integration filter 750.

Outside the bandwidth of the PLL 705, the effect of the feedback decreases. This makes setting the gain $K_{FM}$ of the VCO 710 ("VCO gain $K_{FM}$") to its designed value critical. As illustrated by chart 900 of FIG. 9, it also means a wider bandwidth can achieve better modulation accuracy. In the EDGE transmit system, the modulation accuracy (measured using error vector magnitude (EVM)) improves significantly as the bandwidth of the PLL 705 increases from 25 k to 75 kHz.

Calibration is required to accurately set the VCO gain $K_{FM}$. This can be accomplished by scaling the FM signal (e.g., by α in FIG. 7) to compensate for variations in the VCO gain $K_{FM}$ and thereby stabilizing the $K_{FM}v_{FM}$ product. Ideally, the VCO gain $K_{FM}$ should be set low to minimize the added noise from the FM signal. This is because the VCO gain $K_{FM}$ amplifies the added noise (due to circuit and quantization effects) associated with the FM signal. In practice, the VCO gain $K_{FM}$ cannot be set too low as there are linearity issues as well as FM signal amplitude limits.

The $K_{FM}v_{FM}$ product sets the range of the frequency modulation. That is, the maximum frequency deviation $\Delta f_{max}$ is simply $$\Delta f_{max} = K_{FM}\max(v_{FM}),$$

where max($v_{FM}$) represents the peak or amplitude of the FM signal. In general, the required $\Delta f_{max}$ for reasonable performance is about four to five times the system's symbol rate.

The design shown in FIG. 7 of the direct VCO modulation system for multi-mode applications is complicated. It requires the ability to achieve different $\Delta f_{max}$ ranges and as such different $K_{FM}v_{FM}$ products. In practice, the VCO gain $K_{FM}$ must be set for the largest required $\Delta f_{max}$ since the FM signal amplitude is limited. This means any different $K_{FM}v_{FM}$ products are achieved by changing $\alpha$ and thereby scaling the FM signal. Unfortunately, scaling (e.g., reducing) the amplitude of the FM signal may increase the added noise in the system of FIG. 7. This can be unacceptable when the symbol rate and $\Delta f_{max}$ change dramatically. For example, the symbol rate for GSM/EDGE is 270 ksps while it is 3.84 Msps, or about 14 times larger, for WCDMA.

The multi-mode VCO 710 provides selectable gains $K_{FM}$ to optimally accommodate the different frequency modulation ranges $\Delta f_{max}$. This advantageously allows the amplitude of the FM signal to remain close to its maximum limit, which minimizes added noise.

A detailed view of the VCO 710 is shown in FIG. 10a. The VCO 710 oscillates at a frequency $$f_{osc} = \frac{1}{2\pi\sqrt{(L_1+L_2)C_{eq}}},$$

which is set by the resonance of the LC tank circuit shown in FIG. 10a, where $C_{eq}$ is the equivalent shunt capacitance (comprised of capacitor $C_1$ and varactors $C_{2a}$-$C_{2b}$ plus any parasitic capacitance). The equivalent capacitance $C_{eq}$ may also include coarse-tuning capacitors (not shown) to subdivide the tuning range. The varactor $C_2$ (shown as $C_{2a}$ and $C_{2b}$) allows the VCO 710, by way of the control signal $v_{ctrl}$, to be tuned to different radio frequencies.

Figure 10B:
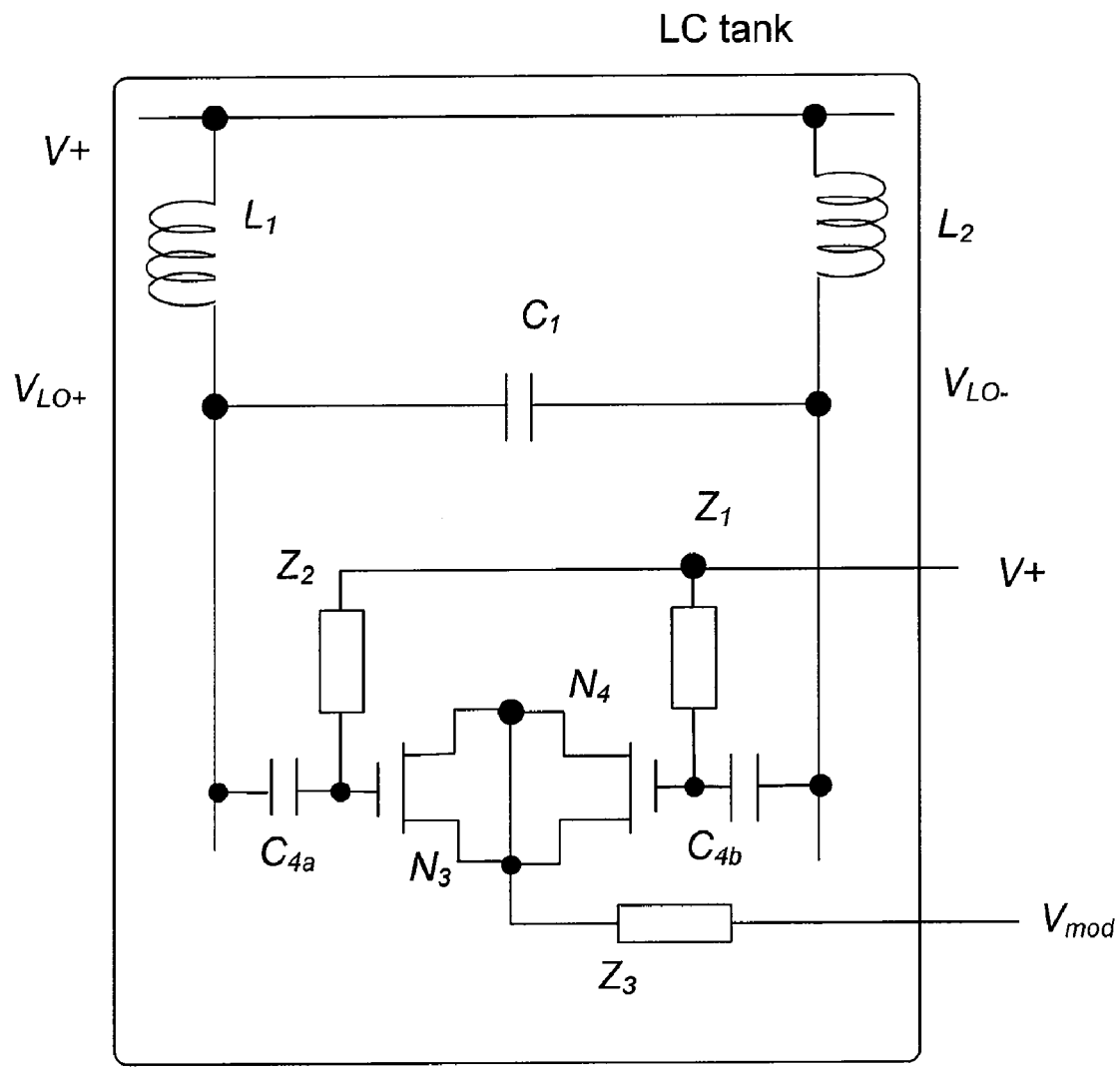
FIG. 10b shows one embodiment of a VCO tank circuit that includes an auxiliary port to support linear phase/frequency modulation.

The LC tank circuit shown in FIG. 10b includes an auxiliary port to support linear phase/frequency modulation. As illustrated in chart 1100 of FIG. 11, the LC tank circuit uses the capacitance of accumulation-mode MOSFET devices N3 and N4 to achieve linear behavior even though these devices display an abrupt response. The accumulation-mode MOSFET devices present a low capacitance $C_{min}$ at applied gate-to-bulk voltages $V_{GB}$ below the threshold voltage $V_T$ while they display a high capacitance $C_{max}$ at applied voltages above $V_T$. Capacitors C4a and C4b block the dc level present at the output of the VCO 710. Resistors Z1-Z2 provide some isolation between the gates of MOSFET devices N3 and N4.

The gate-to-bulk voltage VGB applied to each MOSFET device N3-N4 depends on the VCO's 710 output signal A sin $\omega t$, the FM signal $v_{FM}$, and the common-mode voltage $V_{cm}$ that exists at the connection of the back-to-back devices. The symmetric structure of the VCO 710 means that signals VLO+ and VLO−V1 and V2 are differential with $$V_{LO+} = A \sin \omega t \ \& \ V_{LO-} = -A \sin \omega t,$$

where A is the peak signal of each sinusoidal output and is the oscillation frequency. It follows then that $$V_{C3} = A \sin \omega t + v_{FM} - v_{cm} \ \& \ V_{C3} = -A \sin \omega t + v_{FM} - v_{cm},$$

which describe the gate-to-bulk voltages $V_{GB}$ applied to MOSFET devices $N_3$ and $N_4$. The two MOSFET devices $N_3$ and $N_4$ connect back-to-back in the VCO 710, so their individual capacitances behave oppositely.

The modulation signal $v_{FM}$ affects the MOSFET devices N3 and N4 as follows. The devices nominally present a capacitance equal to $$C_{mid} = C_{FM}(v_{FM}=0) = \frac{C_{min}C_{max}}{C_{min}+C_{max}}.$$

As the FM signal $v_{FM}$ moves positive, both MOSFET devices $N_3$ and $N_4$ reach their maximum capacitance values $C_{max}$, so that for a period of time of approximately $$t = \frac{1}{\omega}\sin^{-1}\left(-\frac{v_{FM}}{A}\right),$$

the structure in FIG. 10b presents a capacitance equal to $C_{max}/2$. A similar response occurs as the FM signal moves negative, which results in the structure in FIG. 10b presenting a capacitance equal to $C_{min}/2$. It is worth noting that the structure in FIG. 10b linearizes the overall response of the accumulation-mode MOSFET devices $N_3$ and $N_4$ to yield the behavior shown in FIG. 12.

FIG. 13 depicts two auxiliary ports (VFM1 and VFM2) in the VCO 710 that each support a different frequency modulation range $\Delta f_{max}$. As shown in FIG. 13, the additional auxiliary port is formed by simply adding another branch of accumulation-mode MOSFET devices N5 and N6 to the resonant tank of the VCO 710.

As illustrated in FIG. 14, a simple switch network 1480 enables the FM signal to drive the multi-mode VCO 1410. One or more filters 1490 may be included to smooth the FM signal after it is scaled by $\alpha$, and to attenuate any alias signals. Each mode of the VCO 1410 requires calibration to operate accurately. Since the VCO gain $K_{FM}$ is constant in each of the modes, the calibration scales the FM signal by $\alpha$, where different values for by $\alpha$ are applied for each mode. Ideally, the system illustrated in FIG. 14 produces similar FM signal amplitudes for the different modes, thus minimizing added noise. As a benefit of the present invention, the multi-mode VCO 1410 enables direct VCO modulation architecture to meet stringent phase noise and modulation accuracy requirements in vastly different modes.

Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A multi-mode voltage-controlled oscillator comprising:
   a voltage control input port to supply a common mode voltage;
   a first auxiliary input port;
   a second auxiliary input port, wherein the first auxiliary input port and the second auxiliary input port are accessed for direct modulation; and
   a LC tank circuit, wherein the LC tank circuit is configured to operate in accordance with a first frequency gain in response to a first signal received at the first auxiliary input port and in accordance with a second frequency gain in response to a second signal received at the second auxiliary input port, wherein the multi-mode voltage-controlled oscillator is configured so that either the first signal is received at the first auxiliary input port or the second signal is received at the second auxiliary input port, wherein the first frequency gain and the second frequency gain are different to cause different frequency modulation ranges.

2. The multi-mode voltage-controlled oscillator of claim 1, wherein the LC tank circuit includes a first network connected to the first auxiliary input port, wherein the first network includes a first plurality of elements selected to achieve the first frequency gain.

3. The multi-mode voltage-controlled oscillator of claim 2, wherein the LC tank circuit includes a second network connected to the second auxiliary input port, wherein the second network includes a second plurality of elements selected to achieve the second frequency gain.

4. The multi-mode voltage-controlled oscillator of claim 3, wherein the multimode voltage-controlled oscillator is coupled to a differentiator device operative to produce the first signal and the second signal.

5. The multi-mode voltage-controlled oscillator of claim 4, wherein the differentiator device includes a multiplier that scales the first signal by a first value during operation in a first mode and the second signal by a second value during operation in a second mode.

* * * * *